United States Patent
Hazelton

(10) Patent No.: US 6,724,000 B2
(45) Date of Patent: Apr. 20, 2004

(54) REACTION FRAME APPARATUS AND METHOD

(75) Inventor: Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 140 days.

(21) Appl. No.: 10/151,589

(22) Filed: May 16, 2002

(65) Prior Publication Data

US 2003/0213919 A1 Nov. 20, 2003

(51) Int. Cl.$^7$ ................................................. G21K 5/10
(52) U.S. Cl. ...................... 250/442.11; 318/649; 355/72
(58) Field of Search .................... 250/442.11; 318/649; 355/72

(56) References Cited

U.S. PATENT DOCUMENTS

| | | | |
|---|---|---|---|
| 5,260,580 A | 11/1993 | Itoh et al. | |
| 5,528,118 A | 6/1996 | Lee | |
| 5,610,686 A | 3/1997 | Osanai | |
| 5,874,820 A | 2/1999 | Lee | |
| 5,953,105 A | 9/1999 | Van Engelen et al. | |
| 5,959,427 A | 9/1999 | Watson | |
| 5,982,128 A | * 11/1999 | Lee | 318/568.16 |
| 6,281,654 B1 | * 8/2001 | Lee | 318/649 |
| 6,496,248 B2 | * 12/2002 | Tanaka | 355/72 |
| 6,529,260 B2 | * 3/2003 | Sogard | 355/39 |

OTHER PUBLICATIONS

Reaction Force Isolation Frame, Hazelton et al., U.S. Appl. No. 09/932,410, filing date Aug. 17, 2001.
Base Assembly For a Stage Chamber of a Wafer Manufacturing System, Binnard et al., U.S. App. No. 09/843,076, filing date Apr. 27, 2001.

* cited by examiner

*Primary Examiner*—John R. Lee
*Assistant Examiner*—Paul M. Gurzo
(74) *Attorney, Agent, or Firm*—Leland Wiesner; Wiesner and Associates

(57) ABSTRACT

A reaction frame having a first reaction frame portion and a second reaction frame portion receives reaction forces from a stage. First reaction frame portion is coupled to ground by a ground rod aligned along the longitudinal side of the first reaction frame portion; second reaction frame portion of the reaction frame is coupled to an interconnect rod passing parallel to the plane defined by the first reaction frame portion and second reaction frame portion. Ends of interconnect rod have a damper therebetween. One end is coupled to the first reaction frame portion while the other end is coupled to the second reaction frame portion. Reaction forces in received by the second reaction frame portion are transferred to ground through the interconnect rod and the first reaction frame portion. Alternately, the interconnect rod does not use the damper when alligned with the ground rod.

57 Claims, 10 Drawing Sheets

US 6,724,000 B2

REACTION FRAME APPARATUS AND METHOD

BACKGROUND OF THE INVENTION

The present invention relates generally to the methods and system for using an improved reaction frame to isolate reaction forces created during manufacturing and further includes using the improved reaction frame in a photolithographic system for precision manufacturing of semiconductor devices.

Overlaying or superimposing many layers of circuit patterns on a wafer typically produces the semiconductor device. The circuit pattern is first formed in a reticle and transferred onto a surface layer of the wafer through photolithography. This requires precise alignment of the wafer relative to the reticle during the photolithography process.

A typical photolithography apparatus includes an illumination source, a reticle stage assembly retaining a reticle, a lens assembly and a wafer stage assembly (i.e., the object stage) retaining a semiconductor wafer. The reticle stage assembly and the wafer stage assembly are supported above ground with an apparatus frame. Typically, the wafer stage assembly includes one or more motors to precisely position the wafer and the reticle stage assembly.

The typical wafer stage assembly includes a stage base, a first stage and a second stage. The stages move relative to the stage base to position the wafer. The first stage is used for relatively large movements of the wafer along an X-axis. The second stage is used for relatively large movements of the wafer along a Y-axis. Existing wafer stage assemblies typically include a fixed guide with an air bearing that inhibits the first stage from moving along the Y-axis and rotating about a Z-axis relative to the stage base.

Motors moving the stage along the X-axis and Y-axis during processing create reaction forces. These reaction forces can be a problem in a photolithographic system used for processing wafers and generating chips because the size and the images transferred onto the wafer from the reticle are extremely small. Vibration introduced by these reaction forces misaligns the wafer and images superimposed on the wafer to create the chip. Consequently, it is critical to the manufacturing of high density, semiconductor wafers to control these reaction forces and keep the wafer or part aligned.

As the circuit density of integrated circuits increases and feature size decreases, alignment errors caused by these reaction forces must be further reduced or eliminated. Conventional reaction frames used to process wafers deliver a majority of the reaction forces to ground. Each portion of the reaction frame is typically attached to ground using a ground rod or some other means to transfer the vibration and reaction force directly to ground.

Unfortunately, some chip manufacturers cannot secure each portion of the reaction frame directly to ground. For example, a manufacturer may only have a single wall available to secure a portion of a reaction frame in a photolithographic system. If portions of the reaction frame are not secured or grounded, reaction forces may continue to introduce vibration and ultimately misalign the wafers during the manufacturing process. It would be advantageous to develop a reaction frame design that works in a variety of different manufacturing situations and addresses this problem. For example, the reaction frame should work to reduce vibration from reaction forces in a photolithography system whether secured to ground by a single wall or by multiple walls.

SUMMARY OF THE INVENTION

In precision manufacturing, a stage assembly holds a wafer or object in place while being processed using photolithography and other precision manufacturing processes. Drive mechanisms moving the wafer or object in one or more degrees of freedom within the stage assembly often create undesirable reaction forces. Left alone, these reaction forces may cause the stage assembly to move, vibrate or lose alignment. To combat these reaction forces, a reaction frame diverts the reaction forces from the stage assembly and reduces vibration and potential misalignment. An improved reaction frame is provided having multiple reaction frame portions that work together to alleviate the effects of the reaction forces. The reaction frame portions are coupled together using an interconnect rod that efficiently transfers reaction forces to ground without causing the reaction frame portions to dynamically couple, rotate or translate in position. The improved reaction frame and interconnect can be used in a variety of precision manufacturing situations including photolithographic processing of wafers One aspect of the invention includes a reaction frame having a first reaction frame portion and a second reaction frame portion that receives reaction forces from a stage. The first reaction frame portion is coupled to ground in a first direction by a ground rod aligned along the longitudinal side of the first reaction frame portion. A second reaction frame portion of the reaction frame not coupled directly to ground in the first direction but is coupled to an interconnect rod passing parallel to the plane defined by the first reaction frame portion and second reaction frame portion. The interconnect rod has a first end and a second end with a damper therebetween, wherein the first end is coupled to the first reaction frame portion and the second end is coupled to the second reaction frame portion and reaction forces in the first direction received by the second reaction frame portion are transferred to ground through the interconnect rod and the first reaction frame portion.

Another aspect of the invention includes a reaction frame having a first reaction frame portion and a second reaction frame portion that receives reaction forces from a stage. Typically, the reaction forces are generated by a drive mechanism moving a stage. The first reaction frame portion of the reaction frame is coupled to ground in a first direction by a first ground rod aligned along the longitudinal side of the first reaction frame. A second reaction frame portion of the reaction frame not coupled directly to ground in the first direction is connected to ground using an interconnect rod having a first end and a second end. The first reaction frame portion is alligned with the ground rod, wherein the first end is coupled to the first reaction frame portion and the second end is coupled to the second reaction frame portion and reaction forces in the first direction received by the second reaction frame portion are transferred to ground through the combination of the interconnect rod and the first reaction frame portion.

Implementations of the invention may include one or more of the following advantages or features. Multiple reaction frame portions making up the reaction frame both absorb reaction forces and transfer the reaction forces to ground through a ground rod. The interconnect rod and damper allows the reaction frame to be separated into reaction frame portions to accommodate different stage assembly configurations. Because the reaction frame is modular, manufacturers can use this reaction frame style under many different situations. With the interconnect rod, the overall reaction frame can be installed with fewer ground rods as the interconnect rod transfers the reaction forces from several reaction frame portions to a ground rod. The damper on the interconnect rod helps prevent multiple reaction frame portions to dynamically coupling causing the reaction frames portions to either rotate or translate causing misalignment. In some cases, the damper may not be necessary if the stage assembly has room to run the interconnect rod between the reaction frame portions aligned along the line of force.

DETAILED DESCRIPTION

Figure 1:
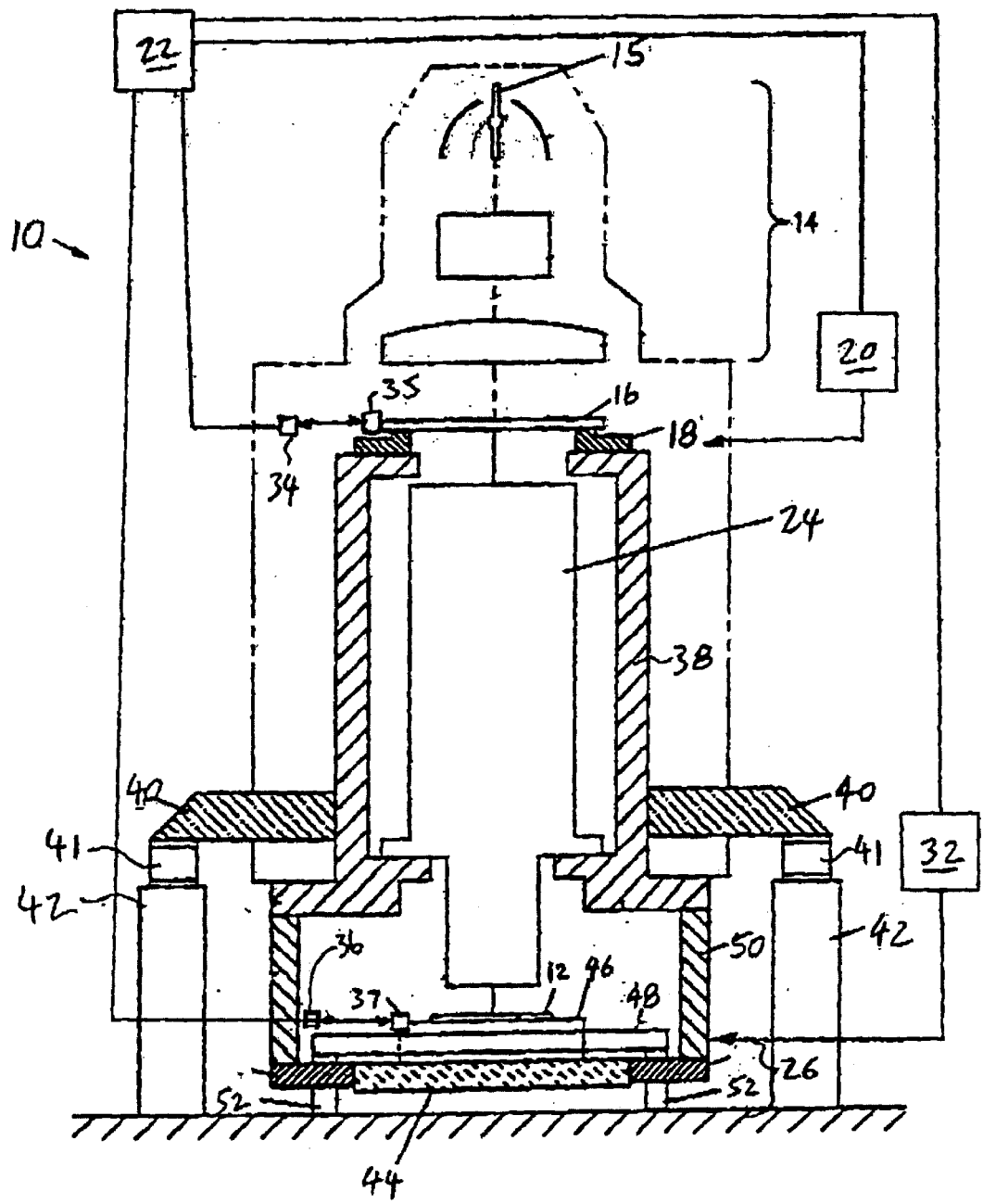
FIG. 1 is a schematic representation of an exposure system that implements a reaction force isolation system in accordance with one embodiment of the present invention.

A photolithography system for processing substrates is one type of exposure apparatus that uses implementations of the present invention. In general, the scope and spirit of the present invention includes reducing the vibrations induced by reaction forces generated in a motor through the use of a reaction frame. The reaction frame isolates reaction forces and vibrations caused by motors used in the photolithography system. It is understood that aspects of the present invention can be used in many other different types of exposure systems for substrate processing including scanning-type, step-and-scan type, projection-type and electron-beam photolithography systems. Aspects of the present invention can also be used in other types of systems including pattern position measurement system, wafer inspection equipment, machine tools, and electron beam microscope for processing other articles FIG. 1 is a schematic representation of an exposure system 10 for processing a substrate, such as a wafer 12, which implements the present invention. In an illumination system 14, light beams emitted from a lamp 15 (e.g., an extra-high pressure mercury lamp) are converged, collimated and filtered into substantially parallel light beams having a wavelength needed for a desired exposure (e.g., exposure of the photoresist on the wafer 12).

The light beams from the illumination system 14 illuminate a pattern on a reticle 16 mounted on a reticle stage 18. Reticle stage 18 is movable in several (e.g., three to six) degrees of freedom by servomotors or linear motors (not shown) under precision control by a driver 20 and a system controller 22. The light beams penetrating reticle 16 are projected on wafer 12 via projection optics 24.

Wafer 12 is held by vacuum suction on a wafer holder (not shown) that is supported on a wafer stage assembly 26 under the projection optics 24. Wafer stage assembly 26 can move wafer 12 in several (e.g., three to six) degrees of freedom using a series of linear motors under precision control by the driver 32 and system controller 22. These linear motors move wafer 12 and position and orient wafer 12 relative to projection optics 24. Driver 32 may provide the user with information relating to X, Y and Z positions as well as the angular positions of the wafer 12 while driver 20 can provide user with information relating to the position of reticle 16.

For precise positional information, interferometers 34 and 36 and corresponding mirrors 35 and 37 are provided to detect the actual positions of the reticle and wafer, respectively, as schematically shown in FIG. 1. For either or each of the wafer stage and reticle stage, a set of three interferometers may be provided for detecting the X, Y and θz (rotation about Z) positions of the wafer stage and/or reticle stage. This positional information can be used to drive the wafer stage and/or reticle stage in the X and Y directions and θz.

By way of example and not limitation, in a scanning-type exposure apparatus, reticle 16 and wafer 12 are scanned and exposed synchronously (in accordance with the image reduction in place) with respect to an illumination area defined by a slit having a predetermined geometry (e.g., a rectangular, hexagonal, trapezoidal or arc shaped slit). This allows a pattern larger than the slit-like illumination area to be transferred to a shot area on wafer 12. After the first shot area has been completed, wafer 12 is stepped by the linear motors to position the following shot area to a scanning start position. This system of repeating the stepping and scanning exposure is called a step-and-scan system. Step-and-scan type exposure method is especially useful for imaging large reticle patterns and/or large image fields on the substrate because it enlarges the exposure area of the reticle and the image field on the wafer. Details of a step-and-scan exposure apparatus are described in U.S. Pat. No. 5,477,304 to Nishi and U.S. Pat. No. 5,715,037 to Saiki et al. assigned to the assignee of the present invention and herein incorporated by reference in their entirety for all purposes.

As illustrated in the FIG. 1, illumination system 14, reticle stage 18 and projection optics 24 are supported by frames 38, 40 and 42. The frames are coupled to the "ground" (or the foundation on which the overall exposure system is supported). Frames 38, 40 and 42 may be coupled to the ground by means of dampers 41 as well as other vibration isolation systems. Vibration isolation systems are commercially available, for example, from Newport Corporation, Irvine, Calif.

Figure 2:
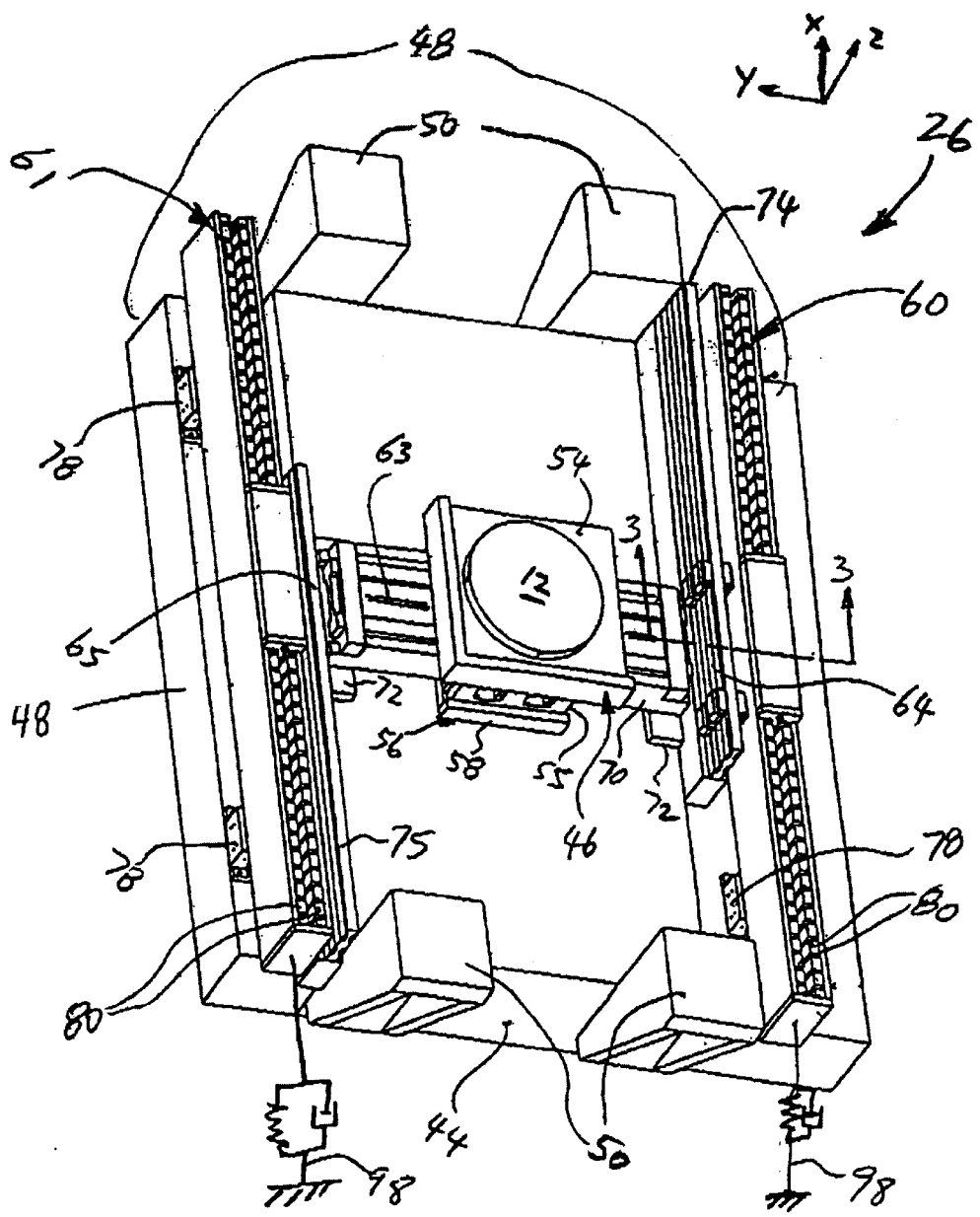
FIG. 2 is a perspective view of a wafer stage assembly adopting the reaction frame in accordance with one embodiment of the present invention.
Figure 3:
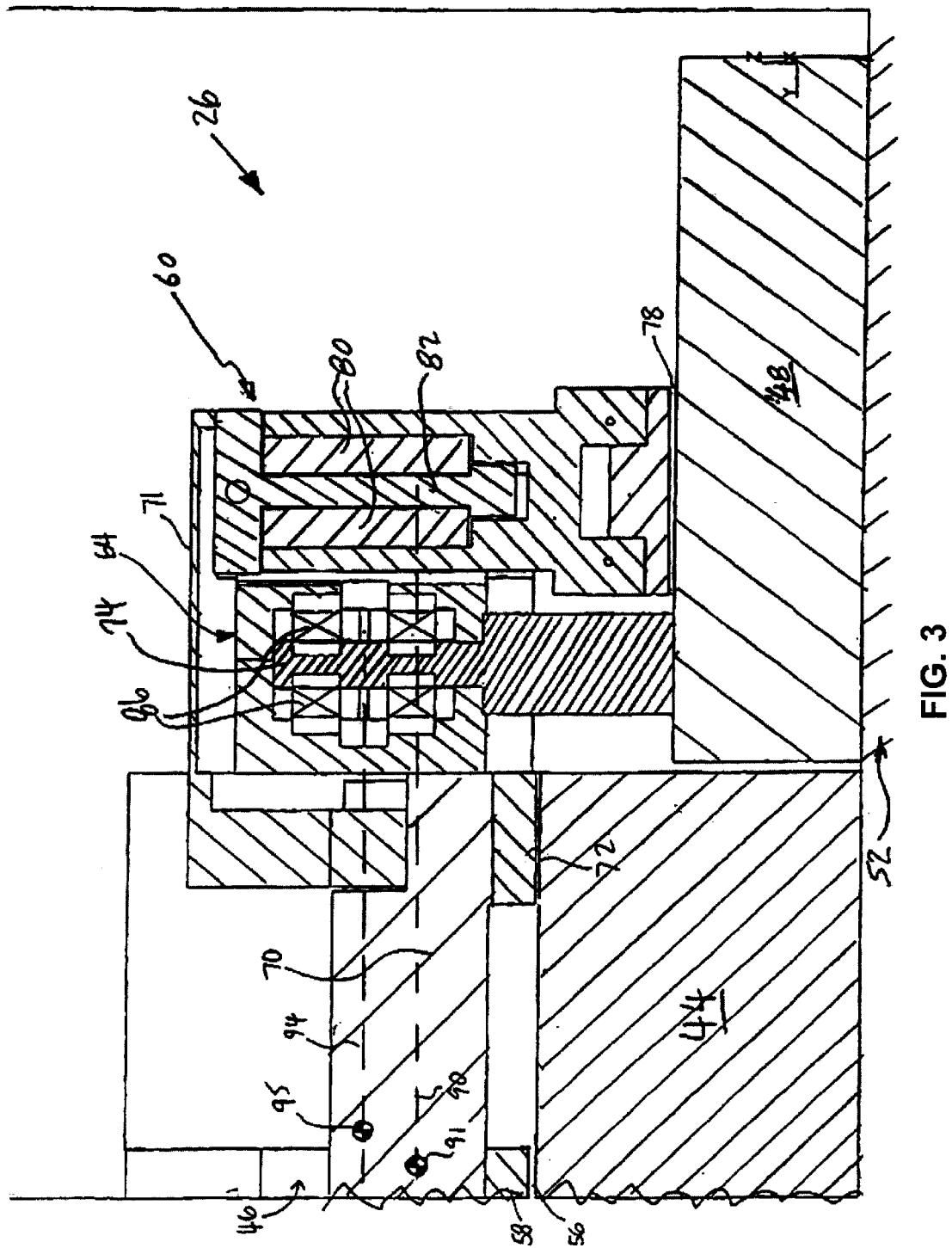
FIG. 3 is a sectional view taken along line 3—3 in FIG. 2.

FIG. 2 and FIG. 3 provide schematic illustrations of wafer stage assembly 26 including an object or wafer stage base 44, a wafer stage 46, actuators and reaction frames 48. Wafer stage base 44 is supported from frame 38 by depending frames 50. Reaction frames 48 are supported by support posts 52 in FIG. 3 that are mounted to ground or a separate base substantially free from transferring vibrations between the posts and wafer stage 46.

Wafer stage 46 includes a wafer table 54 that supports wafer 12 using a wafer chuck (not illustrated) and a leveling stage 55. In one implementation, three voice coil motors levitate wafer table 54 in the vertical plane and provide tilting motions within leveling stage 55. Wafer stage 46 is supported in the space above the base 44 using vacuum pre-load type air bearings 56 acting against the foot 58 of the wafer stage 46. Alternatively, this support could employ a combination of magnets and coils creating a magnetic force that levitates wafer table 54.

Wafer stage 46 is coupled to a guide bar 70 using air bearings and moves along the axis of the guide bar 70 in the Y-direction powered by a linear motor 63. Ends of guide bar 70 are coupled to linear motor 60 and linear motor 61 respectively and together move guide bar 70 in the X-direction. Linear motors 60 and 61 slide in the X-direction and are supported by air bearings 78 on reaction frame 48. The ends of guide bar 70 also ride on air bearings 72 on base 44. Because guide bar 70 is not restricted from movement within a small range in the Y and θz (rotation about Z) directions, it is referred to as a guideless stage.

Actuator 64 is coupled to one end of the guide bar 70 to effect limited trimming motion of the guide bar 70 in the Y-direction. Actuator 64 is supported to ride along track 74, which in turn is rigidly supported on one portion of reaction frame 48. FIG. 2 also shows a second track 75 provided on the other of the reaction frames 48. Another actuator 65 is supported to ride along track 75, in the same way as the actuator 64 on track 74, and effects limited trimming motion of the guide bar of the second wafer stage (not shown) in the Y-direction. Although a single wafer stage is illustrated, this configuration design can also handle a second wafer stage (not shown). Likewise, actuator 65 is supported to ride along track 75 and also effect limited trimming motion with respect to guide bar 70

The reaction forces created from the trimming motion of the guide bar of one wafer stage are isolated from the other wafer stage using actuator 64 and actuator 65 separated by track 74 and track 75. For a single wafer stage system, second track 75 and actuator 65 may be omitted from the system. Alternatively, more than one wafer stage may be coupled to the same track for Y-direction trimming. Further, two Y-direction actuators and corresponding tracks may be provided at both ends of each guide bar to effect Y-direction trimming motions.

Magnetic actuators are used in linear motors 60, 61 and 63 and the actuators 64 and 65 are magnetic actuators in the implementation as illustrated. By appropriately controlling the actuators with controller 22 (FIG. 1) wafer table 54 can be precisely positioned with respect to projection optics 24 thereby exposing photoresist and placing an image on the wafer's surface.

In the embodiment illustrated, the effective range of the linear motors 60 and 61 extends longitudinally in the X-direction. Referring also to FIG. 3, the linear motors 60 and 61 each comprises a pair of linear arrays 80 of permanent magnets as the "stator" and a coil 82 as the "mover" in the linear motor. Mover/coil 82 slides along the stator/array 80 and is attached to guide bar 70 via coupling 71. Air bearings 72 and actuator 64 guide movement of mover/coil 82. Linear motor 63 in the guide bar can be configured as a shaft type, commutated, linear motor similar to the linear motor disclosed in U.S. patent application Ser. No. 09/557,122 assigned to the assignee of the present invention and fully incorporated by reference herein.

Actuator 64 and actuator 65 in FIG. 2 each include a set of magnetic E-cores and magnetic I-core illustrated in FIG. 3 as coils 86 and track 74 and track 75 respectively. When the coils on one side of the track are selectively energized, the I-core is magnetically attracted to the E-core on the energized side and moves laterally by a slight amount within the clearance in the space between the I-core and the E-core pair.

Together, by selectively actuating linear motors 60, 61 and 63 and actuators 64 and 65, wafer stage 46 can be actuated to move in X, Y and θz (rotation about Z) directions. Specifically, differentially actuating the linear motors 60 and 61 facilitates rotating wafer stage 46 about the Z-axis because the guide bar 70 is a guideless stage. Additional control of leveling stage 55 allows wafer table 54 to be moved in a total of 6 degrees of freedom with respect to the base 44.

In one implementation, linear motors 60 and 61 and corresponding line of action of the forces are in the same plane (represented by dotted line 90 in FIG. 3) as the combined center of gravity 91 of the wafer stage 46 (including the wafer table 54) and the guide bar 70. This ensures that the forces associated with linear motors 60 and 61 do not cause a resultant rotational moment or torque in the Y-axis about the center of gravity 91 of the combined structure causing potential exposure misalignment.

Similarly, linear motor 63 and corresponding line of action of the forces along the guide bar 70 are along plane 94 and the center of gravity 95 of the wafer stage 46 and wafer table 54. Actuators 64 and 65 lines of action in the Y-direction are in plane 94; the center of gravity 95 of wafer stage 46 and wafer table 54. This ensures that forces from linear motor 63 and actuators 64 and 65 do not cause a rotational moment or torque about the center of gravity 95 of the wafer stage 46 causing potential exposure misalignment. For the structure illustrated, center of gravity 95 of wafer stage 46 is above center of gravity 91 of the larger combined structure of the wafer stage 46 and the guide bar 70. Ideally, the two centers of gravities 91 and 95 are in the same plane to eliminate rotational moments from the actuation forces. Since the combined structure of guide bar 70 and wafer stage 46 is not a rigid integral structure, one component may induce residual torque on another if the center of gravity 91 and center of gravity 95 are not aligned. Details on the relationships of actuation forces with respect of center of gravity are explained, for example, in U.S. Pat. No. 5,959,427 and U.S. patent application Ser. No. 09/557,122, both assigned to the assignee of the present invention and herein incorporated by reference in their entirety.

Linear motors 60 and 61 slide in reaction to movement of guide bar 70 and wafer stage 46. The inertia of linear motors 60 and 61 limits sliding motion in the X-direction from the reaction force because linear motors 60 and 61 are supported on air bearings 78 movable in the X-direction. At the ends of linear motors 60 and 61, dampers 98 are coupled to ground to absorb reaction forces in the X-direction and dampen the high frequency vibrations associated with a high frequency servo loop used with the motors.

Y actuators 64 and 65 impart their reaction forces in the Y-direction on the reaction frame 48 through tracks 74 and 75 supported on reaction frame 48. Further, reaction forces of linear motor 63 in guide bar 70 imparts its reaction forces in the Y-direction on the guide bar 70, which in turn transmits such reaction forces to the Y actuators 64 and 65 connected thereto. Reaction frame 48 in effect supports the Y-direction reaction forces of the linear motor 63 using Y actuators 64 and 65 and guide bar 70.

Reaction frames 48 are structurally decoupled from wafer stage 46 by separating the wafer stage base 44 from reaction frames 48. Presence of the air bearing 78 situated between reaction frame 48 and wafer stage 46 decouples reaction forces in the X-direction from the reaction frames 48. Wafer stage 46 is vibration isolated from ground because support for wafer stage 46 and reaction frames 48 are structurally isolated from base 44. This effectively isolates reaction forces associated with the various actuators from wafer stage 46.

It can be appreciated from the previously described implementations that the present invention provides a reaction force isolation system that isolates reaction forces in the X, Y and θz directions. The actuations in these directions isolate reaction forces from the rest of the system by grounding the reaction frame and isolating the reaction frame from the rest of the system. The present invention is particularly useful to isolate reaction forces from actuations of the additional degrees of freedom in a guideless stage. The wafer stage assembly 26 may be adapted to accommodate more than one wafer stage on the base 44. The reaction forces attributed to each wafer stage are isolated in accordance with the present invention; and therefore do not adversely affect the other wafer stage(s).

Figure 4:
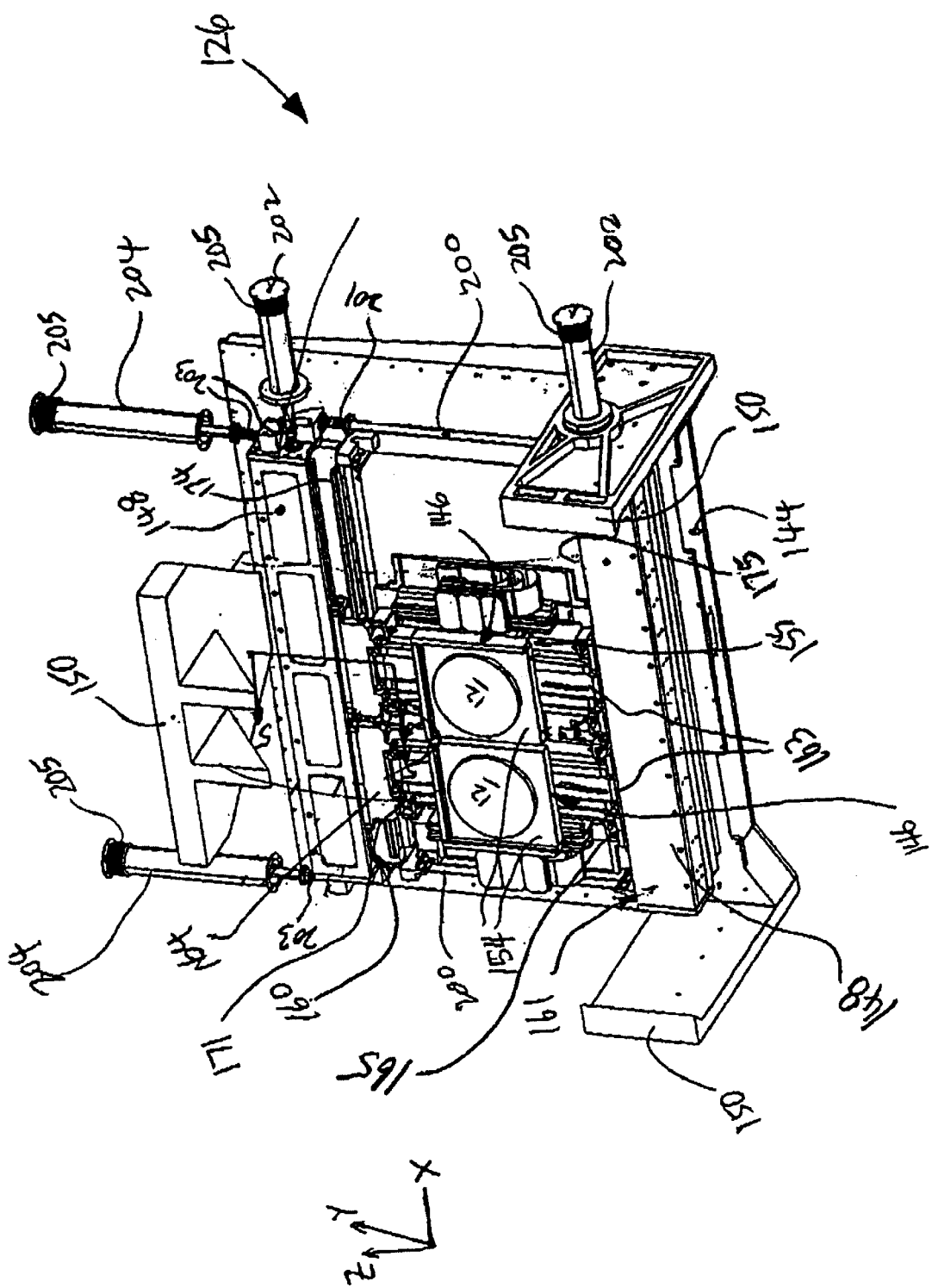
FIG. 4 is a perspective view of a wafer stage assembly adopting the reaction frame in accordance with another embodiment of the present invention.
Figure 5:
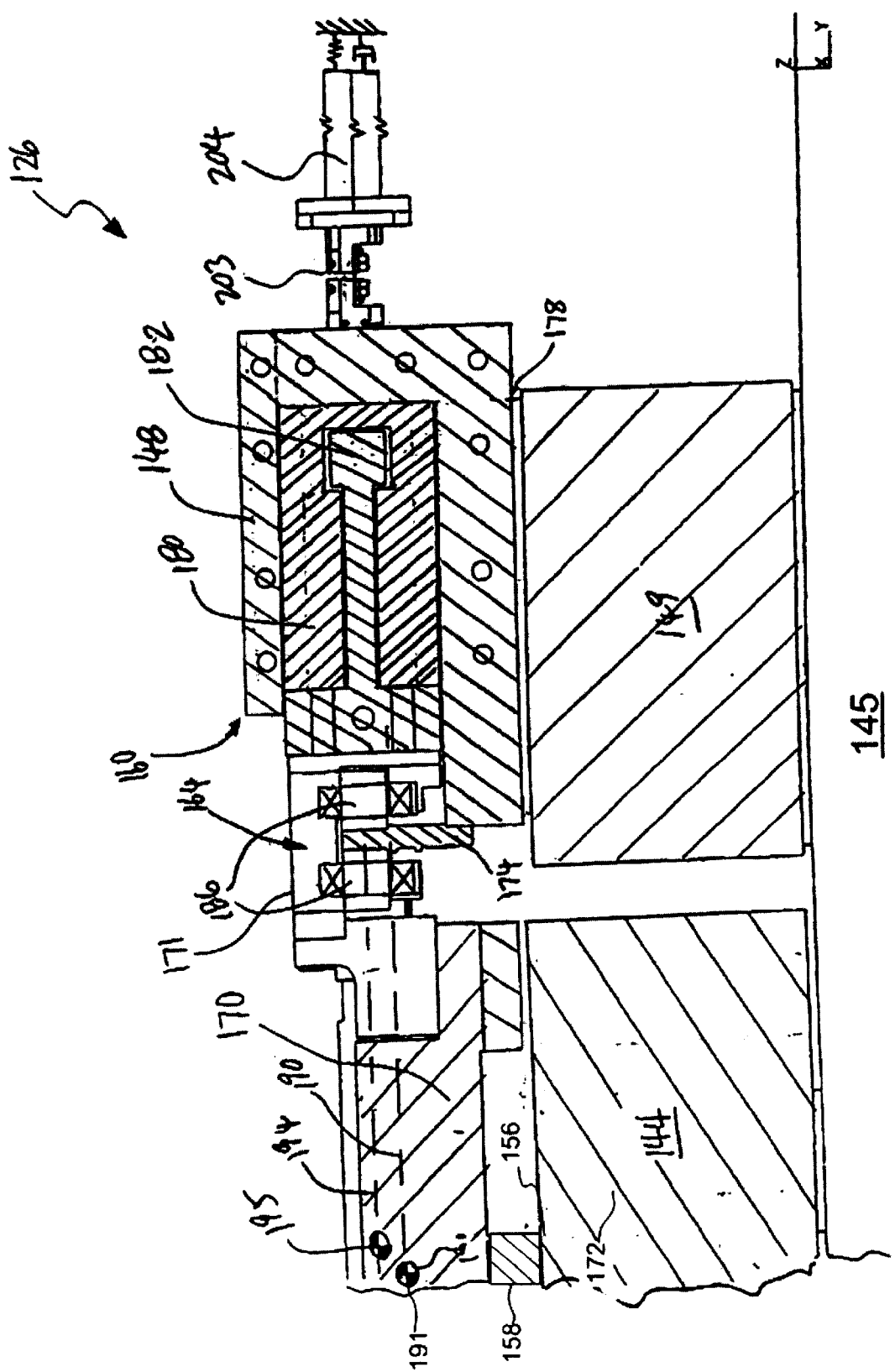
FIG. 5 is a sectional view taken along line 5—5 in FIG. 4.

FIG. 4 and FIG. 5 illustrate another embodiment of the present invention directed to a wafer stage assembly 126 with a common platform 145 supporting reaction frames 148 and the wafer stage base 144. In this implementation, two wafer stages 146 are shown even though the scope and spirit of the present invention also covers implementations having one wafer stage or many wafer stages. Platform 145 is supported from the frame 38 (FIG. 1) by depending frames 150.

As in other implementations, wafer stage 146 includes a wafer table 154 for supporting wafer 12 by means of a wafer chuck (not shown) and a leveling stage 155. Wafer stage 146 is supported in the space above the base 144 via vacuum pre-load type air bearings 156 acting against the base 158 of the wafer stage 146. Alternatively, this support could employ a combination of magnet and coils that create a magnetic force to levitate the wafer table 154.

Wafer stage 146 is coupled to guide bar 170 by air bearings (not shown) for movement along the axis of guide bar 170 in the Y-direction using linear motor 163. Linear motor 160 and linear motor 161 are coupled to each end of guide bar 170 and move guide bar 170 in the X-direction. Linear motor 160 and linear motor 161 are supported within reaction frame 148 in FIG. 5. Base 149 of the reaction frame and wafer stage base 144 are supported on common platform 145. The ends of guide bar 170 ride on air bearings 172 on base 144. The guide bar 170 is allowed a small range of motion in Y and θz (rotation about Z) directions and is a guideless stage. For each wafer stage 146, an actuator 164 is provided at one end of the guide bar 170 to effect limited trimming motion of the guide bar 170 in the Y-direction. Each actuator 164 is supported to ride along track 174 that is rigidly supported on one of reaction frames 148. The track 174 covers the entire span of travel of both guide bars 170 in the X-direction.

In FIG. 4, an optional track and one or more actuators (not shown) may be provided on the other one of the frames 148 and coupled to the other end of one or more of the guide bars 170 (FIG. 5) of the wafer stages 146. A number of configurations may be possible with two or more tracks. For example, two ends of two guide bars may be coupled to the two tracks. Alternatively, only one end of one of the guide bars is coupled to one track and only and one end of the other guide bars is coupled to a different track. For a single wafer stage system, the second track and actuator may be omitted from the system.

Magnetic actuators are used in linear motors 160, 161 and 163 and the actuators 164 and 165 are magnetic actuators in the implementation as illustrated. Other types of drive mechanisms can be used for linear motors 160, 161, and 163 instead of magnetic actuators. By appropriately controlling the actuators with controller 22 (FIG. 1) wafer table 154 can be precisely positioned with respect to projection optics 24 thereby exposing photoresist and placing an image on the wafer's surface.

The effective range of the linear motors 160 and 161 extends longitudinally in the X-direction as illustrated in FIG. 4. Referring also to FIG. 5, the linear motors 160 and 161 each comprise a pair of linear arrays 180 of permanent magnets as the "stator", and a coil 182 as the "mover" in the linear motor, in similar configuration as the linear motors 60 and 61 in the previous embodiment, except that the linear motors 160 and 161 are oriented with the movers/coils horizontally. The mover/coil 182 slides along the stator/array 180. The mover/coil 182 is attached to the guide bar 170 via the actuator 164 and coupling 171, and its movement is guided by air bearings 172 and the actuator 164. The linear motor 163 in the guide bar may be configured as a shaft type, commutated, linear motor.

The actuator 164 comprises a set of magnetic E-cores with coils 186 and a magnetic I-core, which is essentially the track 174. When the coils on one side of the track are selectively energized, the I-core is magnetically attracted to the E-core on the energized side and moves laterally by a slight amount within the clearance in the space between the I-core 174 and the E-core 186 pair.

Together, by differentially actuating the linear motors 160, 161 and 163 and the actuators 164 (and/or 165), each wafer stage 146 may be actuated to move in X, Y and θz (rotation about Z), and together with the leveling stage 155, the wafer table 154 may be moved in a total of 6 degrees of freedom with respect to the base 144. Specifically, because the guide bar 170 is a guideless stage, by differentially actuating the linear motors 160 and 161, the wafer stages 146 may be rotated about Z.

For the same reasons as in the previous embodiment, the line of action of the forces of the linear motors 160 and 161 should be in the same plane (represented by dotted line 190 in FIG. 5) as the combined center of gravity 191 of the wafer stage 146 (including the wafer table 154) and the guide bar 170. Likewise for the linear motor 163 and the actuator 164, ideally the line of action in the Y-direction should be in the same plane 194 as the center of gravity 195 of the wafer stage 146 including the wafer table 154.

When the X linear motors 160 and 161 are actuated to move the guide bar 170 and wafer stage 154, the reaction frames 148 on which the linear motors are supported absorb the reaction forces imparted. The air bearings 178 allow in-plane motion of the ground, to which the reaction frames are attached, relative to the platform 145, thereby not imparting in-plane vibrations from the ground to the platform 145 and the wafer stages supported thereon. Since the reaction frames 148 are supported on air bearings 178, the inertia of the reaction frames 148 reduce somewhat the reaction forces imparted to ground which limit the extent of X-direction motion. The reaction frames 148 are parallel, separated by rods 200. The rods 200 have flexure couplings 201 at their ends connected to the reaction frames 148, which maintain the parallel geometry between the reaction frames and the separation between them. However, because of relative motion in the X-direction, the separation between the reaction frames 148 may possibly change, but only by a negligible amount. An example of a flexure coupling may be found in Flexures: Elements of Elastic Mechanisms by Stuart T. Smith, published by Gordon and Breach Science Publisher, 2000.

Further, rods 202, each having a flexible coupling 203 at each end, connect the end of a reaction frame 148 to ground via a damper/spring 205. The rods 202 transmit the reaction forces acting on the reaction frames 148 in the X-direction to ground where they are absorbed. The flexible coupling 203 allows for limited motion of the reaction frame 148 in the Y and Z directions. The springs 205 dampen the high frequency vibrations from a high frequency servo loop associated with the linear motors 160 and 161.

Similarly, the Y actuator 164 imparts its reaction forces in the Y-direction on the reaction frame 148, via the track 174 supported on the reaction frame 148. Further, the reaction forces of the linear motor 163 in the guide bar 170 imparts its reaction forces in the Y-direction on the reaction frame 148 through guide bar 170 and actuator 164, similar to the previous embodiment. Rods 204, similar to rods 202, and including flexible couplings 203 are provided on the longitudinal side of the reaction frame 148 that has the actuator 164 and are connected to ground. The rods 204 transmit the reaction forces on the reaction frame 148 in the Y-direction to ground, where they are absorbed. In another embodiment, the rods 204 are provided with damper/springs 205 for ground connection. The springs 205 dampen any high frequency vibrations associated with the linear motors 163 for the wafer stages 146.

In this embodiment, the reaction frame is structurally decoupled from the wafer stage by the air bearing 178. Both the X and Y reaction forces are supported by the reaction frames 148, but structurally decoupled from the platform 145 that supports the wafer stage base 144. Because the structure of the reaction frames 148 is isolated from the base 144 on which the wafer stages 146 are supported in X, Y, and θz directions, the reaction forces from the various actuators are effectively isolated from the wafer stages 146. The undesirable vibrations from reaction forces from actuations of one wafer stage 146 are minimized in accordance with the present invention, thus not affecting itself, the rest of the machine, and the other wafer stage 146. As in the previous embodiment, this embodiment also provides a reaction force isolation system that isolates reaction forces from X, Y and θz actuations from the rest of the system by grounding such reaction forces via the reaction frame and isolating the reaction frame from the rest of the system.

Figure 6:
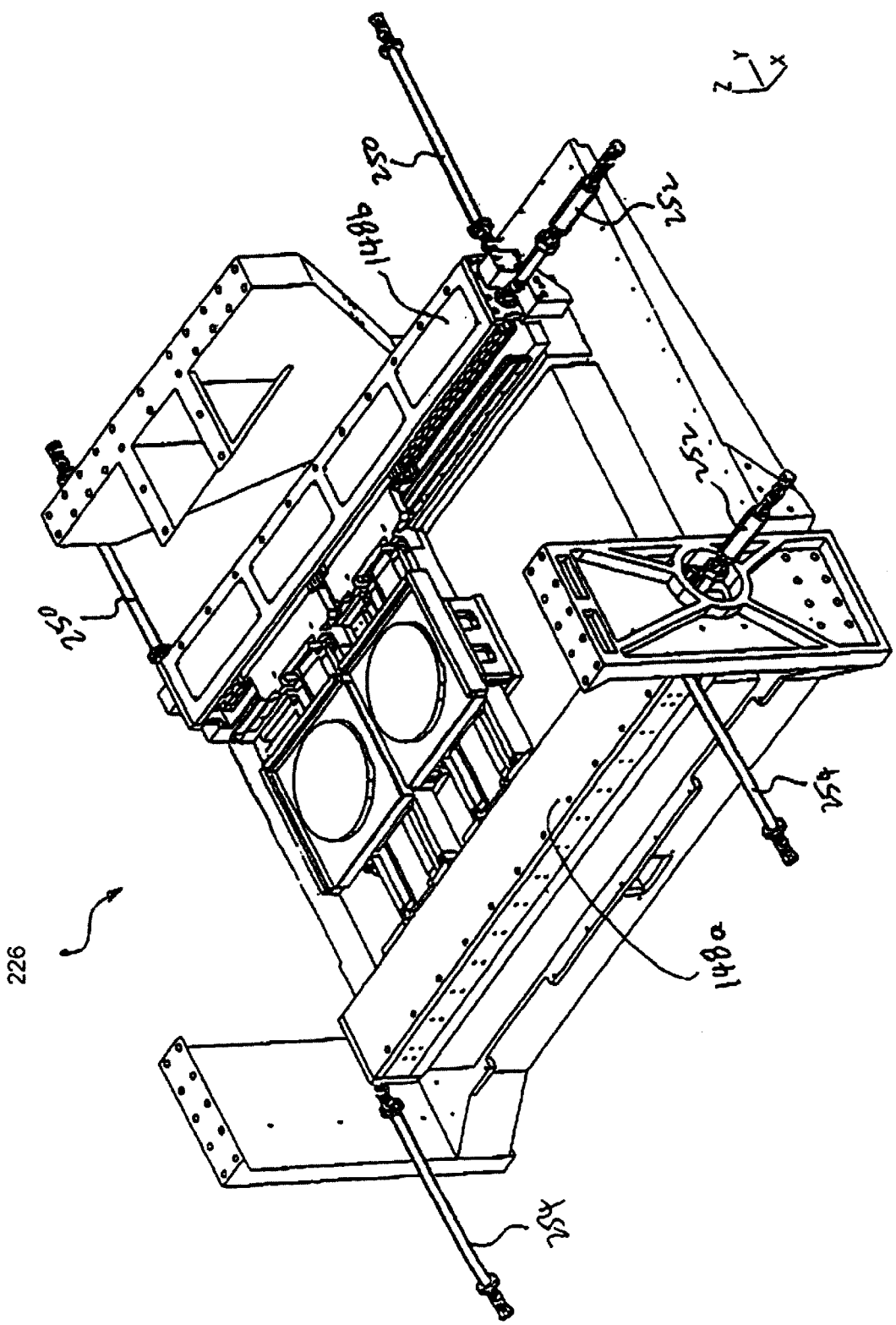
FIG. 6 is a perspective view of a wafer stage assembly adopting the reaction frame in accordance with yet another embodiment of the present invention.

FIG. 6 shows another embodiment of a reaction frame configuration supporting a dual stage wafer stage assembly 226. This embodiment is in large part structurally similar to the embodiment shown in FIG. 4, except that additional reaction rods 254 are provided to ground the Y-direction reaction forces acting on the reaction frame 148a, in addition to the rods 250 for reaction frame 148b, and there are no interconnecting rods between the reaction frames 148a and 148b in this embodiment. The rods 250, 252 and 254 may be similar to rods 202 and 204 in the previous embodiment of FIG. 4.

Figure 7A:
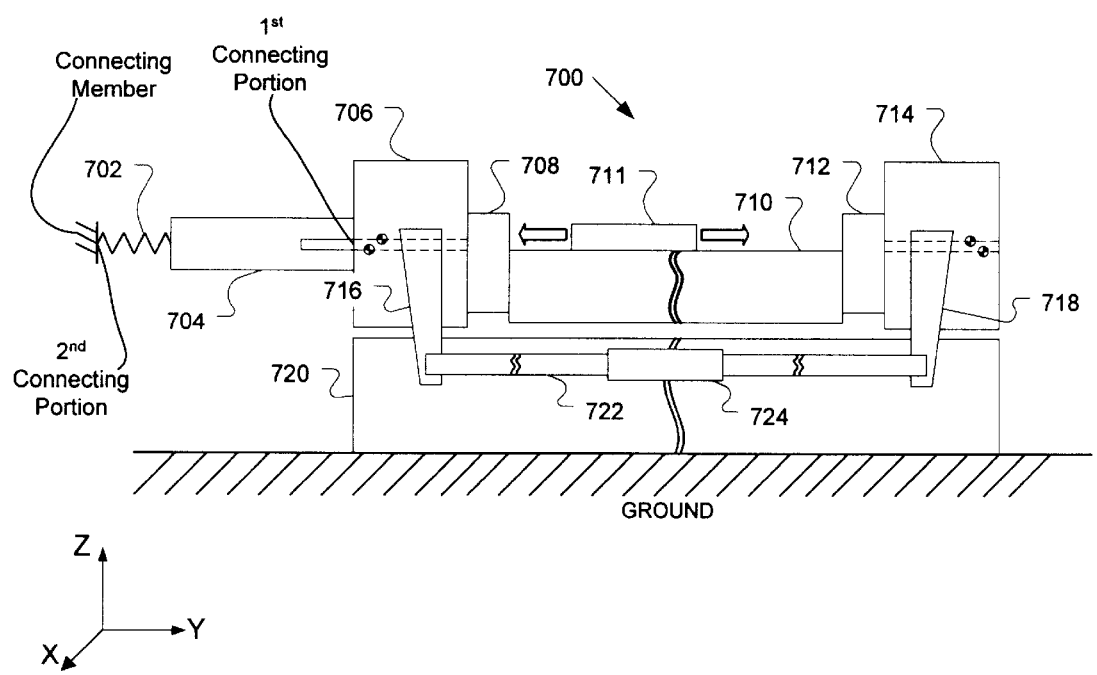
FIG. 7A is a schematic representation of a wafer stage assembly using an interconnect rod and damper between portions of a reaction frame.
Figure 7B:
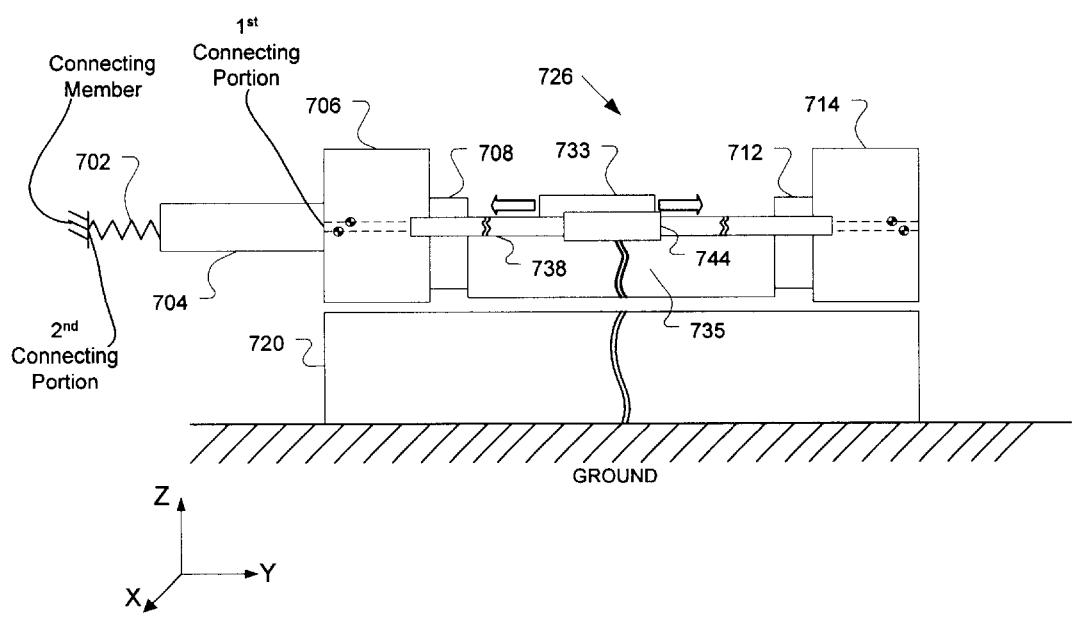
FIG. 7B is a schematic representation of a wafer stage assembly using an interconnect rod aligned along the lines of force between portions of a reaction frame.

FIG. 7A and FIG. 7B illustrate alternate reaction frame implementations of the present invention designed to receive reaction forces generated by a stage. In FIG. 7A, stage assembly 700 has a reaction frame divided into a first reaction frame portion 706 and a second reaction frame portion 714. A stage 710 moves along the X-axis between first reaction frame portion 706 and a second reaction frame portion 714 under the control of drive mechanism 708 and drive mechanism 712. A fixed drive portion of drive mechanism 708 is attached to first reaction frame portion 706 while a movable drive portion of drive mechanism 708 is attached to stage 710. Drive mechanism 712 is constructed and operates in a similar manner with respect to second reaction frame portion 714 and stage 710. Similar drive mechanisms move table 711 along the Y-axis but are not illustrated in the present description.

In one implementation, drive mechanism 708 and drive mechanism 712 are linear or planar motors with a series of permanent magnets used in the fixed drive portions and a set of coils used in the movable drive portions. Selectively energizing the set of coils causes stage 710 to move in the X-direction as previously described. A wafer table 711 supported on stage 710 enables a wafer or other object supported by wafer table 711 to move in the Y-direction also as previously described. Further, differentially actuating drive mechanisms 708 and drive mechanism 712 along other drive mechanisms (not pictured) with wafer table 711 enables stage 710 to move in X, Y, and θz (Theta Z—rotation about the Z-axis) directions.

First reaction frame portion 706 is connected to ground using a ground rod 704 and a spring 702 to dampen high frequency vibrations from the drive mechanisms. Ground rod 704 may be connected to first reaction frame portion 706 using a flexible coupling to allow for limited motion in the Y and Z directions. It is aligned along the longitudinal side of first reaction frame portion 706 and receives reaction forces transmitted to first reaction frame portion 706. The ground is a member and/or structure as the foundation on which the overall exposure system is supported. The exposure system including the wafer stage, the reticle stage, and the projection optics, is isolated from the foundation from transmitting vibrations to the exposure system by dampers 41. One end portion of ground rod 704 may be connected to the ground via the spring 702 and a connecting member (not shown) of the ground. The connecting member is extending from the surface of the ground along the z direction. One end of spring 702 is connected to the end of the ground rod and the other end of the spring 702 is connected to the connecting member. The ground rod 704 and spring 702 are arranged so that between the first connecting portion where the ground rod 704 is connected to the first reaction frame portion 706 and the second connecting portion where the spring 702 is connected to the connecting member is substantially along the same line and substantially same level in the z-direction. To reduce rotational moments from drive mechanism 708 and drive mechanism 712, ground rod 704 can further be aligned along the combined center of gravity associated with wafer stage 710, wafer table 711 and other related structures.

A second reaction frame portion 714 in the reaction frame is parallel to first reaction frame portion 706 as illustrated in FIG. 7A. In one implementation, second reaction frame portion 714 has similar dimensions and weight as first reaction frame portion 706. This second reaction frame portion 714 also receives reaction forces from drive mechanisms moving stage 710 and table 711 in the X, Y, and θz directions. As previously described, the undesirable vibrations from the reaction forces are minimized by isolating the reaction frame from stage 710, table 711 or the rest of the machine. However, second reaction frame portion 714 in FIG. 7A does not have a direct connection to ground through a ground rod like first reaction frame portion 706 described above.

An interconnect rod 722 connects second reaction frame portion 714 to first reaction frame portion and passes parallel to stage 710 and table 711. In this implementation, the ends of interconnect rod 722 connect to each frame portion and pass below stage 710. This interconnect rod 722 passes reaction forces from second reaction frame portion 714 to ground through first reaction frame portion 706. A spring-damper 724 located between the ends of interconnect rod 722 acts to reduce vibrations between the two reaction frame portions as stage 710 and table 711 are actuated by the respective drive mechanisms.

In operation, interconnect rod 722 passes reaction forces between the second reaction frame portion 714 and the first reaction frame portion 706. Reaction forces received by second reaction frame portion 714 pass through interconnect rod 722 and to ground through first reaction frame portion 706. Without spring-damper 724, reaction forces from second reaction frame portion 714 tend to make first reaction frame portion 706 rotate and translate in part because interconnect rod 722 lies below the line of force. If unchecked, dynamic coupling between first reaction frame portion 706 and second reaction frame portion 714 may cause second reaction frame portion 714 to also translate and rotate out of alignment.

Spring-damper 724 acts to reduce the dynamic coupling caused when reaction forces are transmitted between second reaction frame portion 714 and first reaction frame portion 706. Undesirable frequencies are damped before they couple first reaction frame portion 706 and second reaction frame portion 714. This reduces the rotational and translational inertia applied to first reaction frame portion 706 and second reaction frame portion 714 in FIG. 7A as actuators move stage 710 and table 711. Without spring-damper 724, some reaction forces would not be transmitted to ground potentially causing a wafer or part in stage assembly to become misaligned during processing.

In a given system, the characteristics selected for spring-damper 724 depends on a number of factors including overall system design as well as the dynamic interaction over a time period between second reaction frame portion 714 and first reaction frame portion 706. Spring-damper 724 can be adjusted or designed to accommodate frequencies known to have deleterious effects on precision manufacturing processes. As previously described, including spring-damper 724 reduces the chances for dynamic coupling. For example, spring-damper 724 can be designed to reduce midlevel frequencies that cause misalignment of the stage assembly leading to production delays or generally lower production yields.

FIG. 7B illustrates another implementation of the presentation invention where an interconnect rod 738 connects between first reaction frame portion 706 and second reaction frame portion 714 along the line of force. This implementation requires sufficient room in stage assembly 700 for interconnect rod 722 to pass without interfering with other structures of stage assembly 700. Spring-damper 744 illustrated in FIG. 7B may optionally be used in this implementation depending on how closely aligned interconnect rod 738 is with the line of force. If interconnect rod 738 is aligned with the line of force, spring-damper 744 may not be required.

As previously described, drive mechanisms moving wafers stage 710 and table 711 move in the X, Y, and θz (Theta Z) directions create reaction forces. First reaction frame portion 706 transmits reaction forces to ground through ground rod 704. Because second reaction frame portion 714 is not connected to ground, reaction forces are transmitted to ground through interconnect rod 722 in FIG. 7B, first reaction frame portion 706 and ground rod 704. Positioning interconnect rod 722 relative to the line of force reduces the tendencies for either first reaction frame portion 706 or second reaction frame portion 714 to rotate or translate position. Spring-damper 744 is generally not required in the stage assembly in FIG. 7B as the reaction forces do not cause first reaction frame portion 706 and second reaction frame portion 714 to dynamically couple when respective drive mechanisms move stage 710 and table 711. Reaction forces transmitted to second reaction frame portion 714 along the line of force tend not to cause first reaction frame portion 706 to rotate and translate.

There are a number of different types of lithographic devices in which the present invention may be deployed. For example, the exposure apparatus 10 can be used as scanning type photolithography system that exposes the pattern from the reticle onto the wafer with the reticle and wafer moving synchronously. In a scanning type lithographic device, the reticle is moved perpendicular to an optical axis of the projection optics 24 by the reticle stage assembly 18 and the wafer is moved perpendicular to an optical axis of the projection optics 24 by the wafer stage assembly (26, 126). Scanning of the reticle and the wafer occurs while the reticle and the wafer are moving synchronously.

Alternately, the exposure apparatus 10 can be a step-and-repeat type photolithography system that exposes the reticle while the reticle and the wafer are stationary. In the step and repeat process, the wafer is in a constant position relative to the reticle and the projection optics 24 during the exposure of an individual field. Subsequently, between consecutive exposure steps, the wafer is consecutively moved by the wafer stage perpendicular to the optical axis of the projection optics 24 so that the next field of the wafer 12 is brought into position relative to the projection optics and the reticle for exposure. Following this process, the images on the reticle are sequentially exposed onto the fields of the wafer so that the next field of the wafer is brought into position relative to the projection optics 24 and the reticle.

Further, the present invention can also be applied to a proximity photolithography system that exposes a mask pattern by closely locating a mask and a substrate without the use of a lens assembly.

The use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head.

The illumination source 15 can be g-line (436 nm), I-line (365 nm), KrF excimer laser (248 nm), ArF excimer laser (193 nm) and F2 laser (157 nm). Alternately, the illumination source 15 can also use charged particle beams such as an x-ray and electron beam. For instance, in the case where an electron beam is used, thermionic emission type lanthanum hexaboride (LaB6) or tantalum (Ta) can be used as an electron gun. Furthermore, in the case where an electron beam is used, the structure could be such that either a mask is used or a pattern can be directly formed on a substrate without the use of a mask.

In terms of the magnification of the projection optics 24 included in the photolithography system, the projection optics 24 need not be limited to a reduction system. It could also be a 1× or magnification system.

With respect to the projection optics 24, when far ultra-violet rays such as the excimer laser are used, glass materials such as quartz and fluorite that transmit far ultra-violet rays are preferable to be used. When the F2 type laser or x-ray is used, the lens assembly 208 should preferably be either catadioptric or refractive (a reticle should also preferably be a reflective type), and when an electron beam is used, electron optics should preferably consist of electron lenses and deflectors. The optical path for the electron beams should be in a vacuum.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one or more of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above-described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Further, semiconductor devices can be fabricated using the above described systems, by the process shown generally in FIG. 7. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process and packaging process), then finally the device is inspected in step 306.

Figure 8:
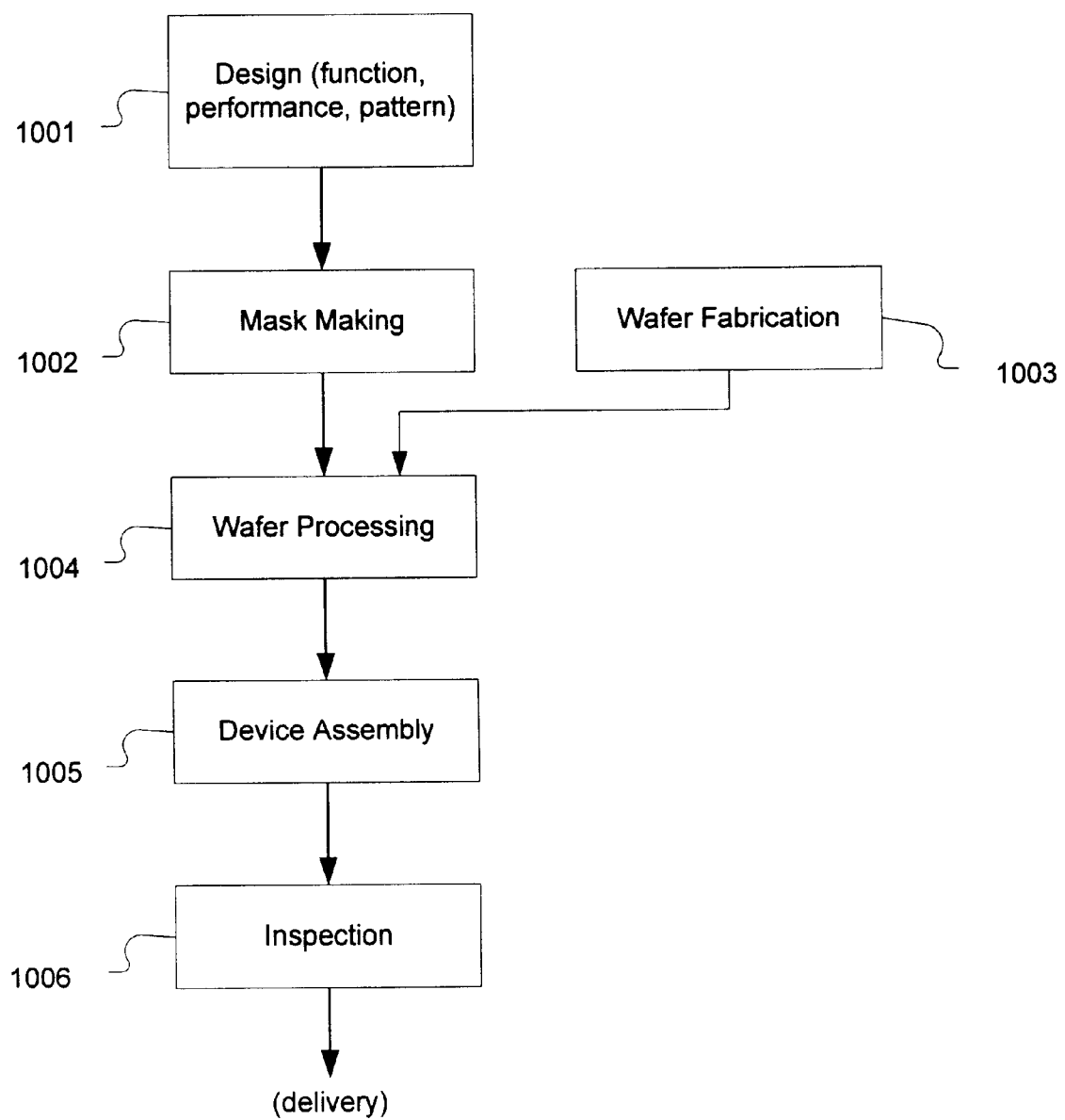
FIG. 8 is a flow chart that outlines a process of manufacturing a device in accordance with one embodiment of the present invention.
Figure 9:
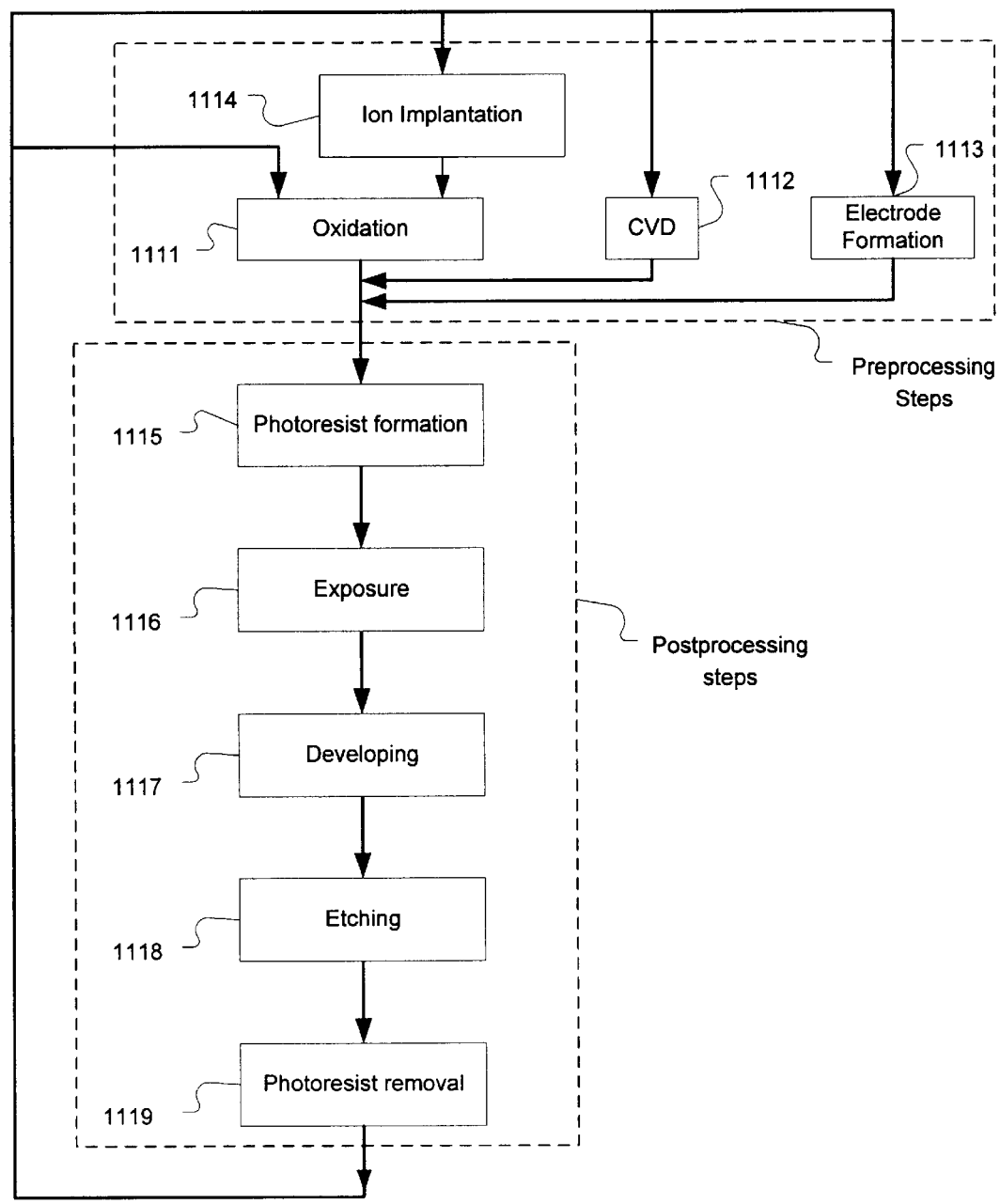
FIG. 9 is a flow chart that outlines the process of manufacturing a device in more detail.

FIG. 8 illustrates a detailed flowchart example of the above-mentioned step 304 in the case of fabricating semiconductor devices. In FIG. 8, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While the invention has been described with respect to the described embodiments in accordance therewith, it will be apparent to those skilled in the art that various modifications and improvements may be made without departing from the scope and spirit of the invention. For example, configuration of the exposure system described above generally corresponds to a step-and-scan exposure system that is known in the art. However, it is to be understood that the present invention disclosed herein is not to be limited to step-and-scan exposure systems and specifically to wafer processing systems that use step-and-scan exposure systems. The general reference to a step-and-scan exposure system is purely for illustrating an embodiment of an environment in which the concept of isolation of motor reaction forces to reduce system vibration may be advantageously adopted. Accordingly, it is to be understood that the invention is not to be limited by the specific illustrated embodiments, but only by the scope of the appended claims.

What is claimed is:

1. An apparatus having a reaction frame that receives reaction forces from a stage comprising:
   a first reaction frame portion of the reaction frame coupled to ground in a first direction by a ground rod aligned along the longitudinal side of the first reaction frame;
   a second reaction frame portion of the reaction frame not coupled directly to ground in the first direction; and
   an interconnect rod passing parallel to the plane defined by the first reaction frame portion and second reaction frame portion having a first end and a second end with a damper therebetween, wherein the first end is coupled to the first reaction frame portion and the second end is coupled to the second reaction frame portion and reaction forces in the first direction received by the second reaction frame portion are transferred to ground through the interconnect rod and the first reaction frame portion.

2. The apparatus of claim 1 further comprising:

a first drive mechanism having a fixed drive portion and a movable drive portion, the fixed drive portion coupled to the first reaction frame portion and the movable drive portion coupled to the stage that moves in at least the first direction; and a slidable coupling between the fixed drive portion and the movable drive portion associated with the first drive mechanism that structurally decouples the first reaction frame portion from the stage in at least the first direction.

3. The apparatus in claim 2 wherein each slidable coupling further includes an air-bearing.

4. The apparatus of claim 1 further comprising:

a second drive mechanism having a fixed drive portion and a movable drive portion, the fixed drive portion coupled to the second reaction frame portion and the movable drive portion coupled to the stage that moves in at least the first direction; and a slidable coupling between the fixed drive portion and the movable drive portion of the second drive mechanism that structurally decouples the second reaction frame portion from the stage in at least the first direction.

5. The apparatus in claim 4 wherein each slidable coupling further includes an air-bearing.

6. The apparatus of claim 1 further comprising:

a base;

a first slidable coupling supporting the stage on the base that decouples the stage from the reaction frame in at least the first direction; and a second slidable coupling supporting the reaction frame on the base that decouples the reaction forces between the stage and the reaction frame.

7. The apparatus in claim 6 wherein each slidable coupling further includes an air-bearing.

8. The apparatus in claim 1 wherein the first direction is along the interconnect rod.

9. The apparatus in claim 1 wherein the reaction frame is free to move in X, Y, and Theta Z degrees of freedom with respect to the base.

10. The apparatus of claim 1 wherein the ground rod is further alligned along the center-of-gravity associated with the first reaction frame portion.

11. The apparatus of claim 1 wherein the damper is implemented using a spring-damper mechanism.

12. A stage assembly, comprising:

a stage guided movably in at least a first direction;

a first reaction frame portion of a reaction frame, the first reaction frame coupled to ground in the first direction by a first ground rod aligned along the longitudinal side of the first reaction frame portion;

a second reaction frame portion of the reaction frame not coupled directly to ground in the first direction; and an interconnect rod passing parallel to the plane defined by the first reaction frame portion and second reaction frame portion having a first end and a second end with a damper therebetween, wherein the first end is coupled to the first reaction frame portion and the second end is coupled to the second reaction frame portion and reaction forces from the stage moving in the first direction received by the second reaction frame portion are transferred to ground through the interconnect rod and the first reaction frame portion.

13. The stage assembly of claim 12 wherein the damper is implemented using a spring-damper mechanism.

14. The stage assembly of claim 12 further comprising:

a first drive mechanism having a fixed drive portion and a movable drive portion, the fixed drive portion coupled to the first reaction frame portion and the movable drive portion coupled to the stage that moves in at least the first direction; and a slidable coupling between the fixed drive portion and the movable drive portion associated with the first drive mechanism that structurally decouples the first reaction frame portion from the stage in at least the first direction.

15. The stage assembly in claim 14 wherein the reaction frame is free to move in X, Y, and Theta Z degrees of freedom with respect to the base.

16. The stage assembly of claim 14 wherein the ground rod is further alligned along the center-of-gravity associated with the first reaction frame.

17. An exposure system comprising:

an illumination system that irradiates radiant energy; and the stage assembly according to claim 14, the stage assembly carrying an object disposed on a path of the radiant energy.

18. An object on which an image has been formed by the exposure system of claim 17.

19. The stage assembly of claim 12 further comprising:

a second drive mechanism having a fixed drive portion and a movable drive portion, the fixed drive portion coupled to the second reaction frame portion and the movable drive portion coupled to the stage that moves in at least the first direction; and a slidable coupling between the fixed drive portion and the movable drive portion that structurally decouples the second reaction frame portion from the stage in at least the first direction.

20. The stage assembly in claim 19 wherein each slidable coupling further includes an air-bearing.

21. The stage assembly of claim 12 further comprising:

a base that the stage is movable thereon;

a first slidable coupling supporting the stage on the base that decouples the stage from the reaction frame in at least the first direction; and a second slidable coupling supporting the reaction frame on the base that decouples the reaction forces between the stage and the reaction frame.

22. The stage assembly in claim 21 wherein each slidable coupling further includes an air-bearing.

23. The stage assembly in claim 12 wherein the first direction corresponds to the length of the interconnect rod.

24. The stage assembly in claim 23 wherein each slidable coupling further includes an air-bearing.

25. A method of processing reaction forces from a stage, comprising:

providing a first reaction frame portion of a reaction frame;

alligning a ground rod attached to ground and coupled along the longitudinal side of the first reaction frame;

providing a second reaction frame portion of the reaction frame; and interconnecting the first reaction frame portion and second reaction frame portion together with an interconnect rod passing parallel to the plane defined by the first reaction frame portion and second reaction frame portion having a damper along the length of the interconnect rod wherein reaction forces in the first direction received by the second reaction frame portion are transferred to ground through the combination of the interconnect rod, the damper and the first reaction frame portion.

26. The method of claim 25 further comprising:

providing a first drive mechanism having a fixed drive portion and a movable drive portion, the fixed drive portion coupled to the first reaction frame portion and the movable drive portion coupled to the stage that moves in at least the first direction; and structurally decoupling the first reaction frame portion from the stage in at least the first direction using a slidable coupling between the fixed drive portion and the movable drive portion associated with the first drive mechanism.

27. The method of claim 25 further comprising:

providing a second drive mechanism having a fixed drive portion and a movable drive portion, the fixed drive portion coupled to the second reaction frame portion and the movable drive portion coupled to the stage that moves in at least the first direction; and structurally decoupling the first reaction frame portion from the stage in at least the first direction using a slidable coupling between the fixed drive portion and the movable drive portion associated with the second drive mechanism.

28. The method of claim 25 further comprising:

providing a base;

structurally decoupling the stage from the base in at least the first direction using a slidable coupling supporting the stage on the base; and structurally decoupling the reaction forces between the reaction frame and the base in at least the first direction using a slidable coupling supporting the reaction frame on the base.

29. The method of claim 28 wherein the reaction frame is free to move in X, Y, and Theta Z degrees of freedom with respect to the base.

30. The method of claim 25 wherein the ground rod is further alligned along the center-of-gravity associated with the first reaction frame.

31. The method of claim 25 wherein the damper is implemented using a spring-damper mechanism.

32. An apparatus having a reaction frame that receives reaction forces from a stage comprising:

a first reaction frame portion of the reaction frame coupled to ground in a first direction by a first ground rod aligned along the longitudinal side of the first reaction frame;

a second reaction frame portion of the reaction frame not coupled directly to ground in the first direction;

an interconnect rod having a first end and a second end alligned with the ground rod, wherein the first end is coupled to the first reaction frame portion and the second end is coupled to the second reaction frame portion and reaction forces in the first direction received by the second reaction frame portion are transferred to ground through the combination of the interconnect rod and the first reaction frame portion.

33. The apparatus of claim 32 further comprising:

a first drive mechanism having a fixed drive portion and a movable drive portion, the fixed drive portion coupled to the first reaction frame portion and the movable drive portion coupled to the stage that moves in at least the first direction; and a slidable coupling between the fixed drive portion and the movable drive portion associated with the first drive mechanism that structurally decouples the first reaction frame portion from the stage in at least the first direction.

34. The apparatus in claim 33 wherein each slidable coupling further includes an air-bearing.

35. The apparatus of claim 32 further comprising:

a second drive mechanism having a fixed drive portion and a movable drive portion, the fixed drive portion coupled to the second reaction frame portion and the movable drive portion coupled to the stage that moves in at least the first direction; and a slidable coupling between the fixed drive portion and the movable drive portion associated with the second drive mechanism that structurally decouples the second reaction frame portion from the stage in at least the first direction.

36. The apparatus in claim 35 wherein each slidable coupling further includes an air-bearing.

37. The apparatus of claim 32 further comprising:

a base;

a first slidable coupling supporting the stage on the base that decouples the stage from the reaction frame in at least the first direction; and a second sidable coupling supporting the reaction frame on the base that decouples the reaction forces between the stage and the reaction frame.

38. The apparatus in claim 37 wherein each slidable coupling further includes an air-bearing.

39. The apparatus in claim 32 wherein the reaction frame is free to move in X, Y, and Theta Z degrees of freedom with respect to the base.

40. The apparatus of claim 32 wherein the ground rod is further alligned along the center-of-gravity of the first reaction frame portion.

41. A stage assembly, comprising:

a stage guided movably in at least a first direction;

a first reaction frame portion of the reaction frame coupled to ground in the first direction by a ground rod aligned along the longitudinal side of the first reaction frame;

a second reaction frame portion of the reaction frame; and an interconnect rod having a first end and a second end alligned with the ground rod, wherein the first end is coupled to the first reaction frame portion and the second end is coupled to the second reaction frame portion and reaction forces in the first direction received by the second reaction frame portion are transferred to ground through the combination of the interconnect rod and the first reaction frame portion.

42. The stage assembly of claim 41 further comprising:

a first drive mechanism having a fixed drive portion and a movable drive portion, the fixed drive portion coupled to the first reaction frame portion and the movable drive portion coupled to the stage that moves in at least the first direction; and a slidable coupling between the fixed drive portion and the movable drive portion associated with the first drive mechanism that structurally decouples the first reaction frame portion from the stage in at least the first direction.

43. The stage assembly in claim 42 wherein each slidable coupling further includes an air-bearing.

44. The stage assembly of claim 41 further comprising:

a second drive mechanism having a fixed drive portion and a movable drive portion, the fixed drive portion coupled to the second reaction frame portion and the movable drive portion coupled to the stage that moves in at least the first direction; and a slidable coupling between the fixed drive portion and the movable drive portion that structurally decouples the second reaction frame portion from the stage in at least the first direction.

45. The stage assembly in claim 44 wherein each slidable coupling further includes an air-bearing.

46. The stage assembly of claim 41 further comprising:

a base that the stage is movable thereon;

a first slidable coupling supporting the stage on the base that decouples the stage from the reaction frame in at least the first direction; and a second slidable coupling supporting the reaction frame on the base that decouples the reaction forces between the stage and the reaction frame.

47. The stage assembly in claim 46 wherein each slidable coupling further includes an air-bearing.

48. The apparatus in claim 41 wherein the reaction frame is free to move in X, Y, and Theta Z degrees of freedom with respect to the base.

49. An object on which an image has been formed by the exposure system of claim 48.

50. The stage assembly of claim 41 wherein the ground rod is further alligned along the center-of-gravity of the first reaction frame.

51. An exposure system comprising:

an illumination system that irradiates radiant energy; and the stage assembly according to claim 41, the stage assembly carrying an object disposed on a path of the radiant energy.

52. A method of processing reaction forces from a stage, comprising:

providing a first reaction frame portion of a reaction frame;

alligning a ground rod attached to ground and coupled along the longitudinal side of the first reaction frame;

providing a second reaction frame portion of the reaction frame not coupled directly to ground in the first direction; and interconnecting the first reaction frame portion and second reaction frame portion together with an interconnect rod having a first end and a second end alligned with the ground rod, wherein the first end is coupled to the first reaction frame portion and the second end is coupled to the second reaction frame portion and reaction forces in the first direction received by the second reaction frame portion are transferred to ground through the combination of the interconnect rod and the first reaction frame portion.

53. The method of claim 52 further comprising:

providing a first drive mechanism having a fixed drive portion and a movable drive portion, the fixed drive portion coupled to the first reaction frame portion and the movable drive portion coupled to the stage that moves in at least the first direction; and structurally decoupling the first reaction frame portion from the stage in at least the first direction using a slidable coupling between the fixed drive portion and the movable drive portion associated with the first drive mechanism.

54. The method of claim 52 further comprising:

providing a second drive mechanism having a fixed drive portion and a movable drive portion, the fixed drive portion coupled to the second reaction frame portion and the movable drive portion coupled to the stage that moves in at least the first direction; and structurally decoupling the first reaction frame portion from the stage in at least the first direction using a slidable coupling between the fixed drive portion and the movable drive portion associated with the second drive mechanism.

55. The method of claim 52 further comprising:

providing a base;

structurally decoupling the stage from the base in at least the first direction using a third slidable coupling supporting the stage on the base; and structurally decoupling the reaction forces between the reaction frame and the base in at least the first direction using a fourth slidable coupling supporting the reaction frame on the base.

56. The method of claim 55 wherein the reaction frame is free to move in X, Y, and Theta Z degrees of freedom with respect to the base.

57. The method of claim 52 wherein the ground rod is further alligned along the center-of-gravity of the first reaction frame portion.

* * * * *